(12) United States Patent
Winderl et al.

(10) Patent No.: US 6,891,252 B2
(45) Date of Patent: May 10, 2005

(54) ELECTRONIC COMPONENT WITH A SEMICONDUCTOR CHIP AND METHOD OF PRODUCING AN ELECTRONIC COMPONENT

(75) Inventors: Johann Winderl, Wackersdorf (DE); Martin Neumayer, Elsendorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/079,114

(22) Filed: Feb. 20, 2002

(65) Prior Publication Data

US 2002/0167078 A1 Nov. 14, 2002

(30) Foreign Application Priority Data

Feb. 20, 2001 (DE) .......................................... 101 08 147

(51) Int. Cl.⁷ .............................................. H01L 29/06
(52) U.S. Cl. ...................................... 257/620; 257/618
(58) Field of Search ................................ 257/618, 620, 257/737

(56) References Cited

U.S. PATENT DOCUMENTS

| 5,583,370 | A | * | 12/1996 | Higgins et al. | ............. 257/787 |
| 5,879,964 | A | | 3/1999 | Paik et al. | ................... 438/113 |
| 5,883,439 | A | * | 3/1999 | Saitoh | ......................... 257/787 |
| 6,043,109 | A | | 3/2000 | Yang et al. | .................. 438/113 |
| 6,043,564 | A | * | 3/2000 | Brooks et al. | .............. 257/620 |
| 6,051,875 | A | * | 4/2000 | Dando | ......................... 257/620 |

FOREIGN PATENT DOCUMENTS

| DE | 37 20 465 C2 | 12/1988 |
| DE | 43 33 407 C1 | 11/1994 |
| DE | 195 00 655 A1 | 7/1996 |
| DE | 196 36 112 A1 | 3/1998 |
| EP | 0 980 096 A1 | 2/2000 |
| JP | 02 144 946 A | 6/1990 |
| JP | 08 031 989 A | 2/1996 |

* cited by examiner

*Primary Examiner*—Gene M. Munson
(74) *Attorney, Agent, or Firm*—Laurence A. Greenberg; Werner H. Stemer; Gregory L. Mayback

(57) ABSTRACT

An electronic component includes a semiconductor chip which has an active upper side and a passive rear side. The semiconductor chip is surrounded by a sawn edge. This edge of semiconductor material has profile-sawn contours. The profile-sawn contours are surrounded by a plastics composition forming an edge of plastic. The plastics composition is in form-locking engagement with the profile-sawn contours. A method of producing a component of this type is also provided.

14 Claims, 3 Drawing Sheets

ELECTRONIC COMPONENT WITH A SEMICONDUCTOR CHIP AND METHOD OF PRODUCING AN ELECTRONIC COMPONENT

BACKGROUND OF THE INVENTION

Field of the Invention

The invention relates to an electronic component with a semiconductor chip which has an active upper side and a passive rear side and is surrounded by a sawn edge.

Electronic components of this type have as a housing or package a plastics composition which surrounds the entire semiconductor chip, including bonding connections to a leadframe or system carrier, and partly the leadframe itself. If the electronic components are intended for identification cards, bank cards, charge cards or cards for locking systems, instead of a package or housing they have, just on their active upper side, a wiring film, which distributes contact areas provided directly on the semiconductor chip among contact terminal areas and/or among external contacts through the use of wiring lines. In such cases, the sawn edge for each individual semiconductor chip at the same time also forms the edge of the electronic component.

Both construction principles for electronic components with semiconductor chips have disadvantages. In the one case, of the semiconductor chip enclosed in plastic, the volume requirement of the electronic component with the plastics package and leadframe is very high and it cannot be used for miniaturized circuit configurations. In the other case, in which a sawn edge directly determines the outer edges of the electronic component, the electronic component is extremely small in volume, especially since the wiring film mentioned can be made extremely thin, but electronic components of this type are sensitive during handling, testing, shipping and further processing, and also during fitting, for example into chip cards. In this case, a high number of rejects must be expected, or special care must be taken during handling. In the one case, the cost-effectiveness is jeopardized by the high number of rejects, in the other case the care during handling requires additional time, which slows down every step of the process and/or requires an additional expenditure for devices for gripping, picking and placing and other manipulations.

SUMMARY OF THE INVENTION

It is accordingly an object of the invention to provide an electronic component which overcomes the above-mentioned disadvantages of the heretofore-known electronic components of this general type and in which the number of rejects can be reduced while at the same time the handling of the components is simplified. In addition, it is an object of the invention to provide a method of producing such an electronic component.

With the foregoing and other objects in view there is provided, in accordance with the invention, an electronic component, including:

a semiconductor chip including a semiconductor material, the semiconductor chip having an active upper side, a passive rear side, and a sawn edge;

the sawn edge being formed of the semiconductor material and surrounding the semiconductor chip, the sawn edge having profile-sawn contours; and a plastics composition forming a plastic edge, the plastic edge surrounding the sawn edge and being in a form-locking engagement with the profile-sawn contours.

In other words, according to the invention, the electronic component has an edge of the semiconductor chip of semiconductor material with profile-sawn contours and is surrounded by a plastics composition forming an edge of plastic, the plastics composition being in positive engagement or form-locking engagement with the profile-sawn contours of the edge of semiconductor material. A form-locking connection or engagement is one which connects two elements together due to the shape of the elements themselves, as opposed to a force-locking connection, which locks the elements together by force external to the elements.

An electronic component of this type with a semiconductor chip which has an active upper side and a passive rear side and is surrounded by a sawn edge has the advantage that the sawn edge of semiconductor material is not directly at risk during handling, since it is surrounded by a plastics composition. However, a plastics composition of this type on a sawn semiconductor edge of a conventional semiconductor chip does not withstand all the stresses arising during processing and operation, so that there is the risk of partial detachment of the edge of plastic. The advantage of the present invention is that the edge of semiconductor material has profile-sawn contours which are configured in such a way that the plastics composition is in a form-locking engagement with the profile-sawn contours and consequently a more intensive bond with the sawn semiconductor edge can be ensured. At the same time, different chamfers can be formed onto the semiconductor chip by specially provided profile contours, so that the edge stability of the semiconductor material is improved.

In a preferred embodiment of the invention, the edge of plastic has a rectangular cross section and is extended toward the active side of the semiconductor chip by a triangular area tapering to a point. This triangular area tapering to a point in the cross section of the edge of plastic is achieved by chamfering the upper edge of the semiconductor chip. Since a wide region is provided in the edge region of the active upper side of each semiconductor chip, which as a sawing track region is not taken up by the active components of the active upper side of the semiconductor chip, chamfering of the edge region is possible without any loss of semiconductor surface.

In a further embodiment of the invention, the edge of plastic has a rectangular cross section with an additional rectangular area widening it toward the active side of the semiconductor chip. In this second embodiment of the invention, a rectangular notching of the edge region is performed instead of the chamfering of the semiconductor chip in the edge region, thereby producing a contour which surrounds the semiconductor material in an L-shaped manner. This L shape can be obtained with the aid of a profile saw when dividing the wafer up into semiconductor chips. The advantage of this L shape is an increased form-locking between the semiconductor material and the plastics composition in the edge region of the semiconductor chip.

In a further embodiment of the invention, the edge of plastic has a cross section with a notch in the active upper side of the semiconductor chip. While the first two embodiments merely chamfer the edge region, in this third embodiment of the invention a groove or depression is made on the active upper side in the edge region of the semiconductor chip. The making of such a notch brings with it the advantage that the form-locking between the plastics composition and the semiconductor is additionally increased. An embodiment of this type may provide that the edge of plastic has a U-shaped cross section with different lengths of its legs, the shorter leg engaging in a groove in the edge region of the active upper side of the semiconductor chip and the longer leg forming an outer edge of plastic for the electronic component. Consequently, the longer leg of the U-shaped cross section corresponds at least to the thickness of the semiconductor chip, while the shorter leg fills the groove made in the profile-sawn contour of the semiconductor material of the edge of the semiconductor chip.

To improve further the adhesive bond of the edge of plastic on the profile-sawn contours of semiconductor material of the semiconductor chip, an adhesion-promoting layer may be provided between the edge of semiconductor material and the plastics composition. An adhesion-promoting layer of this type additionally introduces microscopically fine positively locking, i.e. form-locking engagements, which prevent the plastics composition from peeling away or falling from the profile-sawn edge of the semiconductor material. For this purpose, an adhesion-promoting layer advantageously has a dendritic structure. Such dendritic structures can be applied by electrodepositing metal oxides as an adhesion-promoting layer on the profile-sawn edge of the semiconductor material. The adhesion-promoting layer may include zinc oxide and/or chromium oxide.

Dependent on the respective application of the electronic component, in a further embodiment the active upper side of the semiconductor chip may have an integrated circuit. Integrated circuits of this type are protected against damage by the edge of plastic, since no microcracks can extend into the active region of the semiconductor chip when the semiconductor edge is subjected to impact loading. The damping effect of the edge of plastic causes impacts to be moderated, and direct peeling of semiconductor material in the edge region is prevented. Components protected in this way do not need any special care in handling during further processing, in particular testing and fitting into chip cards. Rather, they can be further processed relatively quickly with simplified automatic pick-and-place machines.

If a wiring film is used for the transition between the contact areas located on the active upper side of the semiconductor chip and the external contacts, in a further embodiment of the invention, a central bonding channel may be provided in the wiring film, and the contact areas of the active upper side of the component may be provided in this bonding channel. The bonding channel in the wiring film serves the purpose of allowing bonding connections to be established from the contact areas on the semiconductor chip to contact terminal areas on the wiring film. Before further processing of a component of this type, the bonding channel with the bonding wires is likewise encapsulated in a plastics composition to protect the bonding wires in the bonding channel. A central bonding channel for centrally provided contact areas on the active upper side of the semiconductor chip is used whenever the semiconductor chip has integrated circuits.

If, as in a further embodiment of the invention, the active elements on the upper side of the semiconductor chip include a contact sensor of a large surface area, a bonding channel is provided in the wiring film in the edge region of the semiconductor chip, so that most of the active upper side of the semiconductor chip is kept free as a sensor surface. In this embodiment of the invention too, the bonding wires are encapsulated in a plastics composition in the laterally provided bonding channel. Therefore, in a further embodiment of the invention, it is advantageous to combine this encapsulation in a plastics composition with the encapsulation of the profile-sawn contours of the semiconductor material, so that only one method step is required for applying the plastics composition both in the bonding channels and in the edge regions.

In a further preferred embodiment of the invention, the wiring film has conductor tracks, which lead from the contact terminal areas of the wiring film to external contacts on the wiring film. The external contacts may in this case be external contacts of a large surface area, to ensure access from the outside to the circuits of the electronic component. They may, however, also be made in the form of contact bumps, to apply an electronic component of this type to printed circuit boards and other wiring substrates.

According to another feature of the invention, the plastic edge has a rectangular cross section which is extended, toward the passive rear side of the semiconductor chip, by a triangular area tapering to a point.

According to yet another feature of the invention, the plastic edge has a rectangular cross section with an additional rectangular area widening the rectangular cross section toward the passive rear side of the semiconductor chip.

According to a further feature of the invention, the plastic edge has a cross section formed with a notch at the passive rear side.

According to another feature of the invention, the plastic edge has a U-shaped cross section with a relatively shorter leg and a relatively longer leg; and the passive rear side of the semiconductor chip has an edge region with a groove formed therein, the relatively shorter leg engages in the groove, and the relatively longer leg forms an outer edge of the plastic edge.

With the objects of the invention in view there is also provided, a method of producing an electronic component, the method includes the steps of:

providing a semiconductor wafer with semiconductor chips disposed in rows and columns and with sawing track regions provided therebetween;

disposing the semiconductor wafer on a carrier;

sawing, with a profile saw, the semiconductor wafer along the sawing track regions;

filling profile sawing tracks with a plastics composition; and separating the semiconductor wafer into semiconductor chips along the plastics composition by using saw blades of a thickness smaller than a sawing track width in the semiconductor wafer filled with the plastics composition for providing a semiconductor chip having an active upper side and a passive rear side such that the semiconductor chip is surrounded by a sawn edge of a semiconductor material, the sawn edge having profile-sawn contours, and such that the sawn edge is surrounded by the plastics composition forming an edge of plastic, and such that the plastics composition is in a form-locking engagement with the profile-sawn contours.

In other words, a method of producing an electronic component of this type includes the following method steps.

Providing a semiconductor wafer with semiconductor chips provided in rows and columns and sawing track regions provided in between, Application of the semiconductor wafer to a carrier, Sawing of the semiconductor wafer along the sawing track regions with a profile saw, Filling of the profile sawing tracks with a plastics composition, Separation of the semiconductor wafer into semiconductor chips along the plastics composition through the use of saw blades of a thickness which is smaller than the sawing track widths in the semiconductor wafer filled with plastics composition.

This method differs from application of the plastics composition at the same time as or in combination with the encapsulation of the bonding channels in that here the edge of plastic is provided and processed for all the semiconductor chips of a semiconductor wafer. This method has the advantage that, apart from the profile sawing step and the subsequent encapsulation of the profile-sawn sawing tracks in a plastics composition, no further steps are required for producing and separating wafers into semiconductor chips.

As an example of how the method is carried out, the introduction of the plastics composition into profile-sawn sawing track regions of a semiconductor chip may be performed through the use of a troweling technique. For this purpose, the plastics composition is pressed into the profile-sawn sawing track regions through the use of a trowel.

A further possible way of filling the profile-sawn regions is to immerse the semiconductor chip with its carrier into a plastics composition and pull it out of the bath of plastic, stripping off the excess plastics composition. This has the advantage that this method can be automated and is suitable for large numbers of wafers.

A further example of how the method is carried out provides that the plastics composition is introduced into the profile sawing tracks through the use of a pressing technique. For this purpose, a spot of plastic is applied to the wafer with the carrier and a ram under ram pressure makes the plastic spread out rapidly and penetrate into the profile sawing tracks.

In a further example of how the method is carried out, the plastics composition is introduced into the profile sawing tracks through the use of a spraying technique. In this method, the excess plastics composition can be centrifugally thrown off the semiconductor wafer. Once the profile sawing tracks have been filled with plastics composition in this way and the plastics composition has been subjected to a curing or conditioning process, the wafer can be separated by a final separating technique through the use of a thin saw blade into individual semiconductor chips, which in each case have an edge of plastic. Advantageously used for this purpose is a saw with saw blades of a thickness which is smaller than the sawing track width in the semiconductor wafer filled with plastics composition.

A further example of how the production method is carried out provides that, before the separation of the semiconductor wafer into semiconductor chips with an edge of plastic, the semiconductor wafer is covered with a wiring film and a wiring operation is carried out. In this operation, the contact areas on the active upper side of the semiconductor chip are connected to external contacts on the wiring film through the use of the wiring lines of the wiring film.

After applying a wiring film of this type and carrying out the wiring operation, the steps of sawing the semiconductor wafer, filling the profile sawing tracks with a plastics composition, and separating the semiconductor wafer into semiconductor chips in accordance with the above-described method can be carried out. In this case, the bonding channels, which are exposed while the wiring operation is being carried out, can likewise be filled at the same time with plastics composition. To carry out the wiring operation, it is not necessary to establish additional bonding connections through the use of bonding wires, but instead exposed flat conductors of the wiring conductor tracks directly above the bonding channels may be connected to the semiconductor contact areas. This technique has the advantage that the bonding region merely takes up the thickness of the wiring film, since no bonding wires protrude out of the bonding channel.

In accordance with a further mode of the invention, solder bumps are applied to the wiring film as external contacts before the wafer is separated into semiconductor components. This has the advantage that, after the wafer has been separated into individual semiconductor chips, not only are the semiconductor chips themselves produced but a functional, fully completed component for use in flip-chip technology is obtained.

When separating a semiconductor wafer, a non-structured semiconductor wafer or a ceramic slice or else steel plates may be used as the carrier material. In one example of how the method is carried out, the semiconductor wafer is adhesively bonded onto these carriers with a thermoplastic adhesive. The softening temperature of the thermoplastic in this case lies below the decomposition temperature of the plastics composition of a thermosetting material, so that, when the chips are adhesively detached from the carrier, the edge of plastic of the individual chips is not damaged. At the same time, the softening point of the thermoplastic or polymer of the adhesive must be high enough that, for the brief instant in which the plastics composition is pressed or introduced into the profile sawing tracks, the sawn chips on the substrate are not displaced in relation to one another.

Another possible way of fixing the semiconductor wafer on a carrier is to use vacuum openings in the upper side of the carrier, but such vacuum openings must be adapted to the chip size, so that, after the profile sawing of the semiconductor wafer, each chip can remain in its position. If an epoxy resin is used as the plastics composition, it can fully cure and crosslink at room temperature, so that it does not begin to melt when the chips are detached from a carrier at elevated temperature. Other irreversible plastics compositions are used on the basis of silicones. Here, too, the curing of the plastics composition achieves the effect of a temperature resistance which makes it possible for the finished electronic component to be detached from a carrier to which the component was bonded through the use of a thermoplastic, without the plastics composition being damaged.

The electronic component according to the invention and the method of producing this component create a component in which not only is a package provided in the region of the bonding channel, but the chip edges are also encapsulated appropriately with regard to mechanical edge protection. This allows the need for care to be taken during handling to be alleviated and the chip edges to be encapsulated through the use of dispensing in such a way that a form-locking engagement is produced between the encapsulant and the chip edge.

Other features which are considered as characteristic for the invention are set forth in the appended claims.

Although the invention is illustrated and described herein as embodied in an electronic component with a semiconductor chip, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
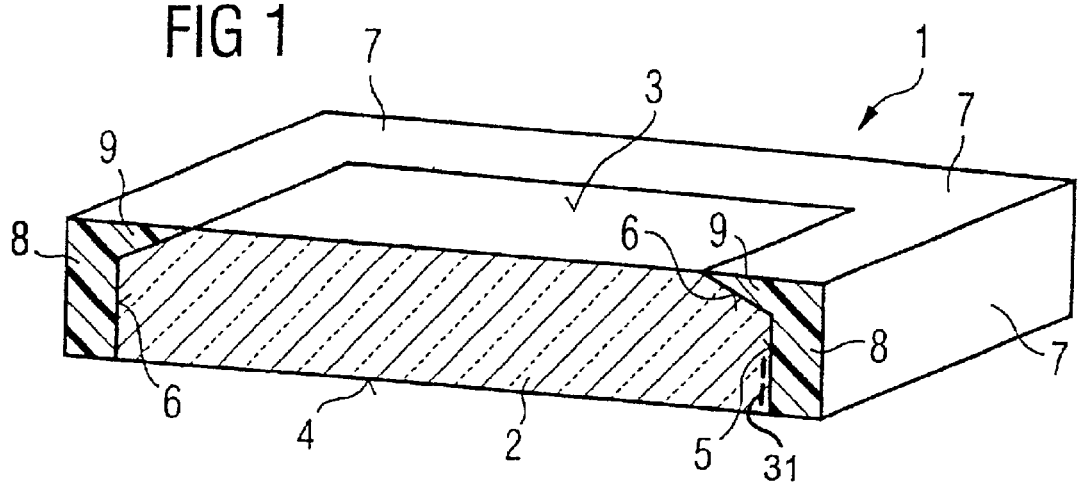
FIG. 1 is a perspective view, partly in cross section, of a first embodiment of the invention.

Referring now to the figures of the drawings in detail and first, particularly, to FIG. 1 thereof, there is shown a perspective view, partly in cross section, of a first embodiment of the invention. In this case, the reference numeral 1 identifies an electronic component, the reference numeral 2 identifies a semiconductor chip, the reference numeral 3 identifies an active upper side of the semiconductor chip 2 and the reference numeral 4 identifies a passive rear side of the semiconductor chip 2. The edge 5 of the semiconductor chip 2 has a profile-sawn contour 6, which is surrounded by an edge of plastic 7 of a plastics composition 8.

The plastics composition 8 is in form-locking engagement with the profile-sawn contours 6, since the edge of plastic completely surrounds the semiconductor chip 2 in the profile-sawn edge region and a triangular area 9 tapering to a point in the direction of the active upper side 3 additionally extends the originally rectangular cross section of the edge of plastic 7 for the form-locking engagement. The cross-sectional profile of the edge of plastic may, in approximation, also be referred to as L-shaped, the transverse leg of the L being represented by the triangular area 9 tapering to a point and the longitudinal leg being represented by the rectangular cross-sectional area of the plastics composition, which at the same time forms an outer edge for the electronic component.

Instead of the semiconductor chip, in the embodiment according to FIG. 1 a semiconductor chip 1 with a wiring film mounted on it may also be surrounded by the edge of plastic 7. A wiring film of this type performs the task of making it possible to fasten the electronic component directly in a chip card or on a printed circuit board and electrically connect it by the microscopically small contact areas, i.e. with dimensions in the range of several micrometers, directly on a semiconductor chip on macroscopic external contact areas, which are perceptible with the naked eye. A wiring film of this type is then an integral part of the semiconductor chip 2 and provides macroscopic external contact areas on its active upper side.

Figure 2:
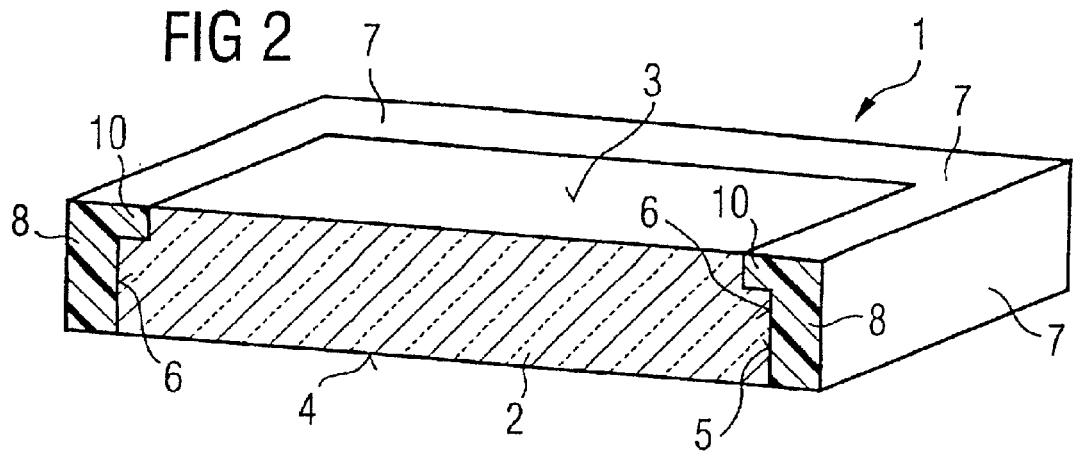
FIG. 2 is a perspective view, partly in cross section, of a second embodiment of the invention.

FIG. 2 shows a perspective view, partly in cross section, of a further embodiment of the invention. Components with the same functions as in FIG. 1 are identified by the same reference numerals, so that there is no need for an additional explanation. The difference between the second embodiment of the invention and the first embodiment is essentially that, instead of a triangular profile which extends in the direction of the active upper side 3 of the semiconductor chip 2, an additional rectangular area 10 is provided for the form-locking engagement of the plastics composition with the profile-sawn contours in the semiconductor material.

The second embodiment according to FIG. 2 accordingly provides a stepped transition from the sawn outer edge of the semiconductor material to the active upper side of the semiconductor chip or the wiring film, which may be attached on the active upper side of the semiconductor chip 2, in order to form macroscopic external terminal areas. A wiring film of this type is preferably applied to a semiconductor chip 2 if the semiconductor chip has integrated circuits on its active upper side 3. If, however, the semiconductor chip is used with its active upper side 3 as a biosensor or contact sensor, the active upper side of the semiconductor chip may directly form the sensor area, without a wiring film covering it. In such cases, however, a bonding channel is often additionally provided at one of the edges, in the edge region of the semiconductor chip, in order both to apply the supply voltage to the contact sensor and also to lead the signal voltage away from the contact sensor or biosensor.

Furthermore, a wiring film may be provided if, as mentioned above, the semiconductor chip carries integrated circuits on its active side and in that case a central bonding channel is left open in the wiring film on the semiconductor chip surface, in order to provide a transition from contact areas of the semiconductor chip provided in a central row and the conductor tracks of the wiring film. If bonding channels of this type for an electronic component are provided, a plastics composition is also provided in the bonding channels in addition to the plastics composition for the edge of plastic, preferably in a single processing step.

Figure 3:
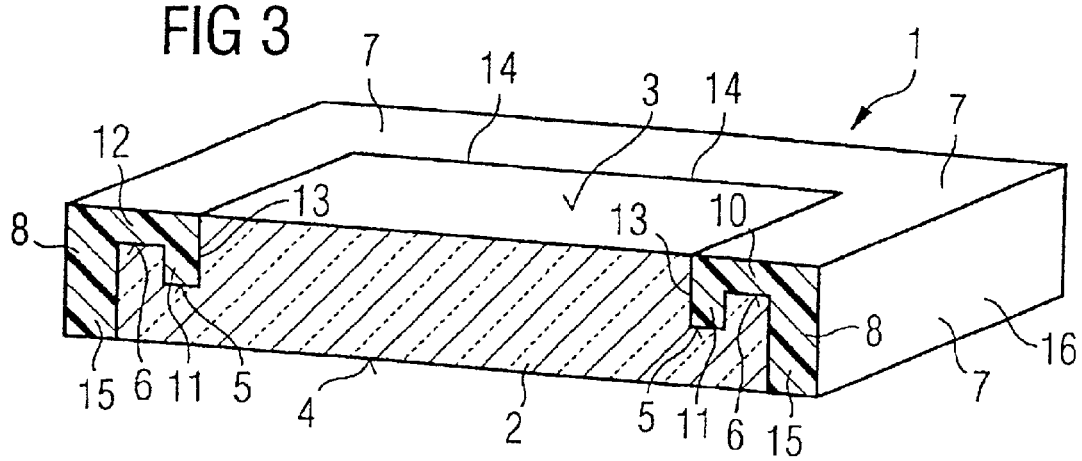
FIG. 3 is a perspective view, partly in cross section, of a third embodiment of the invention.

FIG. 3 shows a perspective view, partly in cross section, of a third embodiment of the invention. Components with the same functions as in FIGS. 1 and 2 are identified by the same reference numerals. As a difference from the first two embodiments, in the third embodiment the form-locking engagement between profile-sawn contours in the semiconductor material and the plastics composition is further improved by an additional notch 11 in the edge region of the active upper side 3 of the semiconductor chip 2.

The overall structure of the edge of plastic consequently creates a U shape, with a longer leg 15, which at the same time forms the outer edge for the electronic component, and a shorter leg 12, which with its plastics composition fills the notch 11, which in the embodiment of FIG. 3 is formed as groove 13. The electronic component with such a plastics composition in the edge region is completely surrounded by an outer edge of plastic 16 and is consequently protected against impacts and other forces which act on the electronic component during testing, transportation or processing.

The adhesive bonding of the plastics composition 8 on the profile-sawn contours 6 of semiconductor material may be improved by an adhesion-promoting layer, which is provided between the semiconductor material and the plastics composition 8. An adhesion-promoting layer of this type is only necessary if extreme loads act on the electronic component during testing, transportation or further processing. An adhesion-promoting layer of this type may be formed of zinc oxides and/or chromium oxides, which have a dendritic structure. Such a dendritic structure can be achieved by electrodepositing the zinc oxides and/or chromium oxides.

The adhesion-promoting layer 31 having a dentritic structure is schematically illustrated as a dashed line in FIG. 1.

Figure 4:
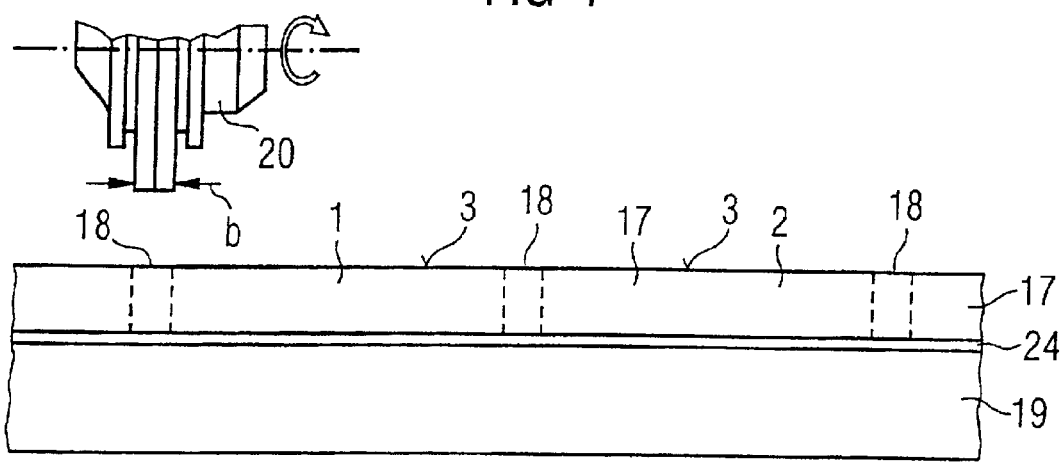
FIG. 4 is a diagrammatic side view of a wafer applied to a substrate, without or with an applied wiring film, before sawing up into individual semiconductor chip regions or individual electronic components.

FIG. 4 shows a basic diagram of a semiconductor wafer 17 applied to a substrate 19, without or with an applied wiring film, before sawing up into individual semiconductor chip regions or individual electronic components. The dashed lines in the region of the semiconductor wafer 17 indicate future sawing track regions 18, which are made in the semiconductor wafer 17 by a profile saw 20. The sawing track regions 18 are kept free of components on the active upper side 3 of each semiconductor chip 2.

The profile saw 20 is used for making the profile-sawn contour 6 of FIG. 3. For this purpose, the profile saw 20 includes a pack of, for example, six closely packed saw blades of different diameters. Two saw blades, which together produce a sawing track width b, have the greatest diameter and two saw blades next to them have the smallest diameter of the saw blades for the profile saw 20. Finally, packed onto these saw blades on the outside there are again saw blades with a slightly increased diameter, which are intended to make the notch 11 of the third embodiment of the invention, which is shown in FIG. 3.

The semiconductor wafer 17 has semiconductor chips 2 provided in rows and columns and the sawing track regions 18 provided in between, so that during sawing the profile saw 20 can be guided in a straight line over the semiconductor wafer 17 adhesively attached to a carrier 19.

Figure 5:
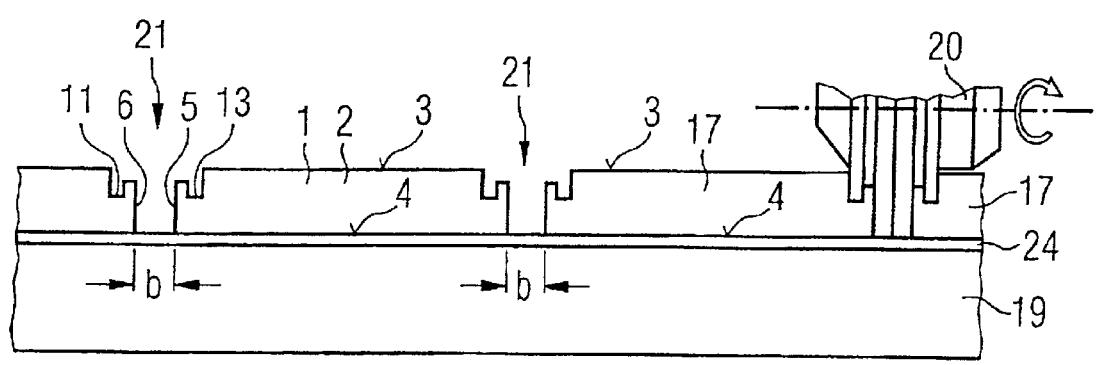
FIG. 5 is a diagrammatic sectional view of a wafer applied to a substrate during sawing with a profile saw into individual semiconductor chip regions or individual electronic components.

FIG. 5 shows a basic diagram of a semiconductor wafer 17 applied to a substrate or carrier 19 during sawing up into individual semiconductor chip regions or individual electronic components through the use of profile saw 20. Depending on the intended use of the semiconductor chip 2, the semiconductor wafer 17 may already carry on its active upper side 3 a wiring film, which is profile-sawn with the semiconductor wafer 17 in FIG. 5. During the profile sawing, as shown in FIG. 5, sawing tracks of the width b are produced in the semiconductor material and, in addition, a profile-sawn contour 6, which in this example of how the embodiment is carried out corresponds to FIG. 3. Consequently, a groove 13 or notch 11 is made at the same time, with the sawing track width b, in the semiconductor material or in the wiring film and reduces the thickness of the edge region of the semiconductor chips, so that a T-shaped cross section is produced after the profile sawing tracks have been filled with a plastics composition.

Figure 6:
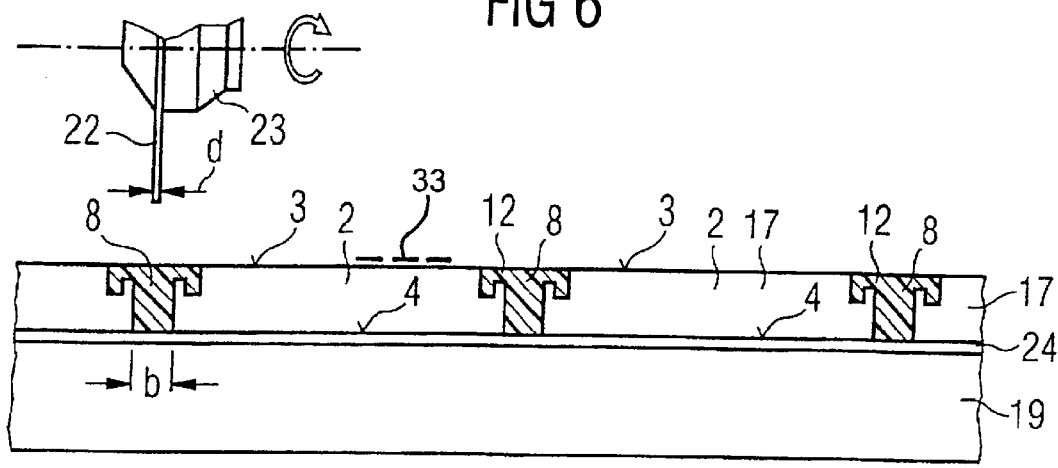
FIG. 6 is a diagrammatic sectional view of a wafer applied to a substrate and profile-sawn after filling of the sawing tracks with a plastics composition.

FIG. 6 shows a basic diagram of a semiconductor wafer applied to a substrate or carrier 19 and profile-sawn, without or with an applied wiring film, after filling of the profile sawing tracks with a plastics composition 8. The plastics composition 8 may be introduced into the profile sawing tracks 21 through the use of a trowling technique, or the profile sawing tracks 21 may be filled with plastics composition 8 through the use of an immersion technique. A wiring film connected to external contacts via wiring lines is schematically illustrated as a dashed line 33.

A further possible way of introducing the plastics composition 8 into the profile sawing tracks 21 is to use the conventional plastics pressing technique. However, this pressing technique, which is usually carried out with an injection-molding device, is rather more suited for surrounding individual chips with an edge of plastic than for filling the profile sawing tracks of an entire wafer with plastics composition.

A further possible way of introducing the plastics composition 8 is to apply it through the use of a spraying or spin-coating technique. At the same time as the plastics composition 8 is introduced into the profile sawing tracks 21, bonding channels of a wiring film can be filled with plastics composition 8, provided that they have been applied to the wafer in such a way that they are adapted to the wafer. For this purpose, the semiconductor wafer 17 is covered with a wiring film and a wiring operation is carried out before the semiconductor wafer 17 is separated into semiconductor chips 2. In this operation, contact areas on the active upper side 3 of each semiconductor chip 2 are connected to external contacts through the use of wiring lines in the wiring film. The external contacts may represent external contact areas or external contact bumps which have been applied to the wiring film.

As shown in FIG. 6, the sawing track width b, which is filled with plastic, is greater than the saw blade thickness d of an individual saw blade 22 of a separating saw 23. Consequently, it is possible to saw the semiconductor chips 2 out of the semiconductor wafer 17 while retaining an edge of plastic or to saw finished electronic components 1 out of the wafer while retaining an edge of plastic. For fastening the semiconductor wafer 17 on the carrier 19, a thermoplastic may be provided as an adhesive layer 24 between the carrier 19 and the semiconductor wafer 17. On the other hand, a two-component resin, which has a higher decomposition temperature than the softening temperature of the adhesive layer 24 after curing and crosslinking of the resin, is used for the plastics composition 8 which fills the profile sawing tracks 21. By matching the thermal properties between the plastics composition 8 and the adhesive layer 24, it can be ensured that the electronic components can be removed from the adhesive layer 24 by heating the substrate 19 without damaging the plastics composition 8.

Figure 7:
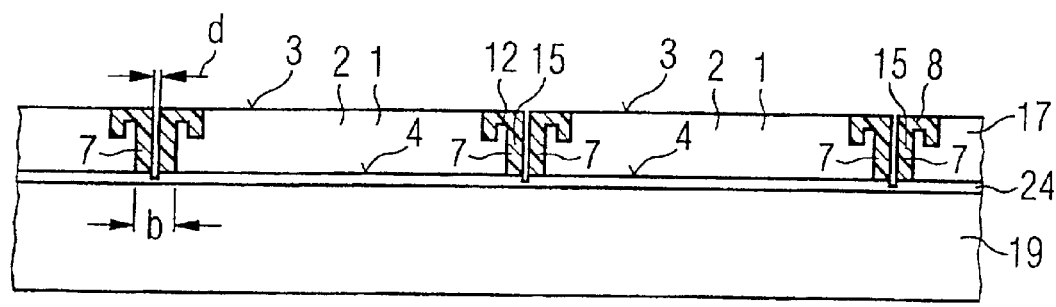
FIG. 7 is a diagrammatic sectional view of a wafer applied to a substrate, without or with an applied wiring film, which has been separated by a separating saw blade into individual semiconductor chip regions with an edge of plastic or into individual electronic components each with an edge of plastic.

FIG. 7 shows a basic diagram of a semiconductor wafer 17 applied to a substrate or carrier 19, without or with an applied wiring film, which has been separated by a separating saw blade 22 into individual semiconductor chips 2 with an edge of plastic 7 or into individual electronic components 1 each with an edge of plastic 7. The separating join between the semiconductor chips 2 or the electronic components 1 corresponds to the thickness d of the separating saw blade 22 from FIG. 6. Since the separating saw blade 22 merely has a saw blade thickness d, it can cut centrally through the plastics composition, which has a greater width b, while leaving behind an edge of plastic 7. This produces for the electronic component 1 an edge of plastic 7 which engages in a form-locking manner with the profile-sawn contour of the semiconductor chip 2.

In the exemplary embodiments described above, those parts of the profile-sawn contours that deviate from a simple cut are provided toward the active upper side of the semiconductor chip. However, it is likewise possible to provide the parts of the profile-sawn contours that deviate from a simple, i.e. straight cut toward the passive rear side. As a result, the active upper side maintains its full area. This may have the advantage that the configuration of the active components on the upper side of the chip are not impaired by parts of the profile-sawn contour.

We claim:

1. An electronic component, comprising:
   a semiconductor chip including a semiconductor material, said semiconductor chip having an active upper side with a central portion and edge portions, a passive rear side, and a sawn edge;
   said sawn edge being formed of said semiconductor material and surrounding said semiconductor chip, said sawn edge having non-straight profile-sawn contours extending into said edge portions of said active upper side; and a plastics composition forming a plastic edge, said plastic edge surrounding said sawn edge and being in a form-locking engagement with said profile-sawn contours;

said central portion of said active upper side being uncovered by said plastics composition.

2. The electronic component according to claim 1, wherein said plastic edge has a cross section formed with a notch at said active upper side.

3. The electronic component according to claim 1, including an adhesion-promoting layer provided between said sawn edge and said plastics composition.

4. The electronic component according to claim 3, wherein said adhesion-promoting layer includes at least one element selected from the group consisting of a zinc oxide and a chromium oxide.

5. The electronic component according to claim 1, wherein said active upper side of said semiconductor chip includes an integrated circuit.

6. The electronic component according to claim 1, wherein said active upper side of said semiconductor chip includes a contact sensor.

7. The electronic component according to claim 1, wherein said plastic edge has a cross section formed with a notch at said passive rear side.

8. An electronic component, comprising:

a semiconductor chip including a semiconductor material, said semiconductor chip having an active upper side, a passive rear side, and a sawn edge;

said sawn edge being formed of said semiconductor material and surrounding said semiconductor chip, said sawn edge having profile-sawn contours; and a plastics composition forming a plastic edge, said plastic edge surrounding said sawn edge and being in a form-locking engagement with said profile-sawn contours;

said plastic edge having a rectangular cross section which is extended, toward said active upper side of said semiconductor chip, by a triangular area tapering to a point.

9. An electronic component, comprising:

a semiconductor chip including a semiconductor material, said semiconductor chip having an active upper side, a passive rear side, and a sawn edge;

said sawn edge being formed of said semiconductor material and surrounding said semiconductor chip, said sawn edge having profile-sawm contours; and a plastics composition forming a plastic edge, said plastic edge surrounding said sawn edge and being in a form-locking engagement with said profile-sawn contours;

said plastic edge having a rectangular cross section with an additional rectangular area widening said rectangular cross section toward said active upper side of said semiconductor chip.

10. An electronic component, comprising:

a semiconductor chip including a semiconductor material, said semiconductor chip having an active upper side, a passive rear side, and a sawn edge;

said sawn edge being formed of said semiconductor material and surrounding said semiconductor chip, said sawn edge having profile-sawn contours; and a plastics composition forming a plastic edge, said plastic edge surrounding said sawn edge and being in a form-locking engagement with said profile-sawn contours;

said plastic edge having a U-shaped cross section with a relatively shorter leg and a relatively longer leg; and said active upper side of said semiconductor chip having an edge region with a groove formed therein, said relatively shorter leg engaging in said groove, and said relatively longer leg forming an outer edge of said plastic edge.

11. An electronic component, comprising:

a semiconductor chip including a semiconductor material, said semiconductor chip having an active upper side, a passive rear side, and a sawn edge;

said sawn edge being formed of said semiconductor material and surrounding said semiconductor chip, said sawn edge having profile-sawn contours; and a plastics composition forming a plastic edge, said plastic edge surrounding said sawn edge and being in a form-locking engagement with said profile-sawn contours;

said plastic edge having a rectangular cross section which is extended, toward said passive rear side of said semiconductor chip, by a triangular area tapering to a point.

12. An electronic component, comprising:

a semiconductor chip including a semiconductor material, said semiconductor chip having an active upper side, a passive rear side, and a sawn edge;

said sawn edge being formed of said semiconductor material and surrounding said semiconductor chip, said sawn edge having profile-sawn contours; and a plastics composition forming a plastic edge, said plastic edge surrounding said sawn edge and being in a form-locking engagement with said profile-sawn contours;

said plastic edge having a rectangular cross section with an additional rectangular area widening said rectangular cross section toward said passive rear side of said semiconductor chip.

13. An electronic component, comprising:

a semiconductor chip including a semiconductor material, said semiconductor chip having an active upper side, a passive rear side, and a sawn edge;

said sawn edge being formed of said semiconductor material and surrounding said semiconductor chip, said sawn edge having profile-sawn contours; and a plastics composition forming a plastic edge, said plastic edge surrounding said sawn edge and being in a form-locking engagement with said profile-sawn contours;

said plastic edge having a U-shaped cross section with a relatively shorter leg and a relatively longer leg; and said passive rear side of said semiconductor chip having an edge region with a groove formed therein, said relatively shorter leg engaging in said groove, and said relatively longer leg forming an outer edge of said plastic edge.

14. An electronic component, comprising:

a semiconductor chip including a semiconductor material, said semiconductor chip having an active upper side with an edge portion, a passive rear side, and a sawn edge;

said sawn edge being formed of said semiconductor material and surrounding said semiconductor chip; and said sawn edge having non-straight profile-sawn contours extending into said edge portion of said active upper side.

* * * * *